United States Patent [19]

Shenai et al.

[11] Patent Number: 5,914,513

[45] Date of Patent: Jun. 22, 1999

[54] ELECTRONICALLY TUNABLE CAPACITOR

[75] Inventors: Krishna Shenai, Naperville; Malay Trivedi, Chicago, both of Ill.

[73] Assignee: The Board of Trustees of The University of Illinois, Urbana, Ill.

[21] Appl. No.: 09/081,389

[22] Filed: May 18, 1998

Related U.S. Application Data

[60] Provisional application No. 60/050,542, Jun. 23, 1997.

[51] Int. Cl.$^6$ .................................................. H03L 29/94
[52] U.S. Cl. .......................... 257/312; 257/595; 257/532; 438/393; 361/277
[58] Field of Search ..................................... 257/312, 532, 257/595; 361/277, 278; 438/381, 393–395

[56] References Cited

U.S. PATENT DOCUMENTS

| | | | |
|---|---|---|---|
| 3,535,600 | 10/1970 | Engeler | 257/532 |
| 3,560,815 | 2/1971 | Sigsbee | 257/532 |
| 3,890,635 | 6/1975 | Engeler | 257/532 |
| 4,003,009 | 1/1977 | Watanbe | 257/532 |
| 4,529,994 | 7/1985 | Sakai | 257/532 |
| 4,529,995 | 7/1985 | Sakai et al. | 257/532 |

*Primary Examiner*—David B. Hardy
*Attorney, Agent, or Firm*—Welsh & Katz, Ltd.

[57] ABSTRACT

A tunable capacitor includes a first capacitor formed from semiconductor material and having a first terminal defining an anode, and a second capacitor integrally formed with the first capacitor from semiconductor material, the second capacitor being operatively coupled in series with the first capacitor, and having a second terminal defining a cathode. The second capacitor is formed as a field effect device or MOSFET configured to provide a depletion region controlled by applying a control voltage to a control terminal of the field effect device. The first capacitor is reverse biased by application of a reverse bias voltage between the anode and the cathode to provide a predetermined capacitance while the control voltage applied to the control terminal of the second capacitor varies the depletion region such that the capacitance of second capacitor is varied independently of the reverse bias voltage.

23 Claims, 5 Drawing Sheets

ELECTRONICALLY TUNABLE CAPACITOR

This application claims priority under 35 USC §119(e) from Provisional Application No. 60/050,542, filed Jun. 23, 1997.

BACKGROUND OF THE INVENTION

The present invention relates generally to a variable capacitor and more specifically to a three terminal semiconductor varactor, the capacitance of which is controlled by a field effect portion of the device via a gate terminal.

Capacitors are basic elements in any electronic circuit, especially in circuits involving AC signals. Filter circuits, in particular, utilize capacitors and inductors to perform tuning and filtering functions. To minimize the size of circuits, it is desirable to fabricate the circuit as an integrated circuit. In such applications, it is necessary to vary the RF parameters of the circuit, which may be done by varying the value of the inductors or the capacitors in the circuit. However, an external inductor is often used in conjunction with an integrated capacitor, as it is difficult to incorporate an inductor into an integrated circuit, depending upon its value. Thus, to achieve circuit tunability, a capacitor is often the component selected to be varied.

Further, it is also known to form an integrated capacitor as a simple pn junction device or diode, often referred to as a variable capacitance diode or varactor diode. A reverse biased diode acts as a capacitor because the free-charge depletion region of a pn junction widens with the application of an increasing reverse bias voltage. Since the surfaces of the free-charge region represent the effective "plates" of a capacitor, the application of increasing reverse bias voltage will cause a decrease in the capacitance.

However, such integrated diode capacitors have significant limitations. To vary the capacitance, the DC voltage or reverse bias voltage of the diode capacitor is varied. This change in DC voltage affects other components in the circuit and causes a change in the optimal setting of other circuit components. For example, an inductor used in such a circuit is typically selected to be optimized for a predetermined DC voltage. A change in the DC voltage to vary the reverse bias voltage and, hence the capacitance of the capacitor, will have an adverse impact on the circuit. Thus, only small variations can be made.

Another limitation of such integrated diode capacitors is that the range of capacitance is severely limited by the useable range of reverse bias voltage. A standard curve (not shown) representing reverse bias voltage (x-axis) as a function of capacitance (y-axis) of the diode capacitor would indicate that capacitance drops off sharply as the magnitude of the reverse bias voltage increases, and levels out with further increasing reverse bias voltages, until breakdown occurs. Thus, to obtain a wide range of capacitance values, the voltage must be varied alone the steep portion of the curve. Accordingly, only a small voltage range is available for affecting the value of capacitance and therefore, the range of capacitance is limited and very difficult to accurately control.

Accordingly, it is an object of the present invention to provide a novel tunable semiconductor capacitor to substantially overcome the above-described problems.

It is an object of the present invention to provide a novel tunable semiconductor capacitor, the capacitance of which is electronically controllable.

It is another object of the present invention to provide-a novel tunable semiconductor capacitor, the capacitance of which is electronically controllable while maintaining a substantially constant reverse bias voltage.

It is yet an object of the present invention to provide a novel tunable semiconductor capacitor formed from capacitors integrally coupled within semiconducting material where one capacitor is reverse biased and the other capacitor is slightly forward biased.

It is a further object of the present invention to provide a novel tunable semiconductor capacitor wherein one capacitor is formed having a field-effect layer configured to provide a variable capacitance.

It is also an object of the present invention to provide a novel tunable semiconductor capacitor, the capacitance of which is varied by a voltage applied to a gate terminal of the field effect layer such that the capacitance is independent of a fixed reverse bias DC voltage level applied.

SUMMARY OF THE INVENTION

The disadvantages of present semiconductor capacitors are substantially overcome with the present invention by providing a novel tunable semiconductor capacitor. The present semiconductor capacitor is useful in all applications where the function of a capacitor is needed. The device is especially useful in electronic applications involving AC signals, filtering, and tuning and is particularly useful in RF applications. Other applications include phase shifters, voltage controlled oscillators, mixers frequency multipliers, non-linear transmission lines, high voltage filters, power converters, protection switches, power supplies, switching power supplies, and the like. The present invention is also advantageous in applications requiring a snubber capacitor where the rate of change of voltage (dV/dt) must be controlled. The present invention provides a variable capacitor having a wide range of capacitance with a tuning ratio of about ten-to-one, according to a specific embodiment.

The novel tunable semiconductor capacitor is superior to known varactor diodes used in variable capacitor applications. In a varactor diode, to vary the capacitance, the magnitude of the reverse bias voltage must be changed. However, this directly affects the other components in the circuit and severely limits the range of capacitance. In the present novel device, the DC reverse bias voltage is not modified because the device is a three terminal device. That is, two terminals namely, the anode and the cathode receive the reverse bias voltage, while a third terminal namely, the gate receives a control voltage which controls the capacitance of the device. Thus, circuit components are optimized for a fixed known DC bias voltage which remains unchanged during tuning of the capacitor.

More specifically, the tunable semiconductor capacitor of one embodiment of the present invention includes a first capacitor formed from semiconductor material having a first terminal defining an anode, and a second capacitor integrally formed with the first capacitor from semiconductor material, the second capacitor being operatively coupled in series with the first capacitor, and having a second terminal defining a cathode. The second capacitor is formed having a field effect layer or MOSFET layer configured to provide an accumulation region, a depletion region or an inversion region, controlled by applying a control voltage to a control terminal or gate of the field effect layer. The second capacitor is more accurately defined as a MOSFET where the cathode of the first capacitor functions as the substrate or body of the second capacitor. The source and drain of the MOSFET are shorted together to provide an external cathode contact.

The first capacitor is reverse biased by application of a reverse bias voltage between the anode and the cathode to provide a predetermined capacitance. As a side effect, the reverse bias voltage applied to the first capacitor causes the second capacitor or MOSFET, to be essentially forward biased in the junction formed by the source and drain with the substrate. The control voltage applied to the control terminal of the second capacitor varies the depletion region such that the capacitance of second capacitor is varied independently of the DC reverse bias voltage.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings.

DETAILED DESCRIPTION

Figure 1:
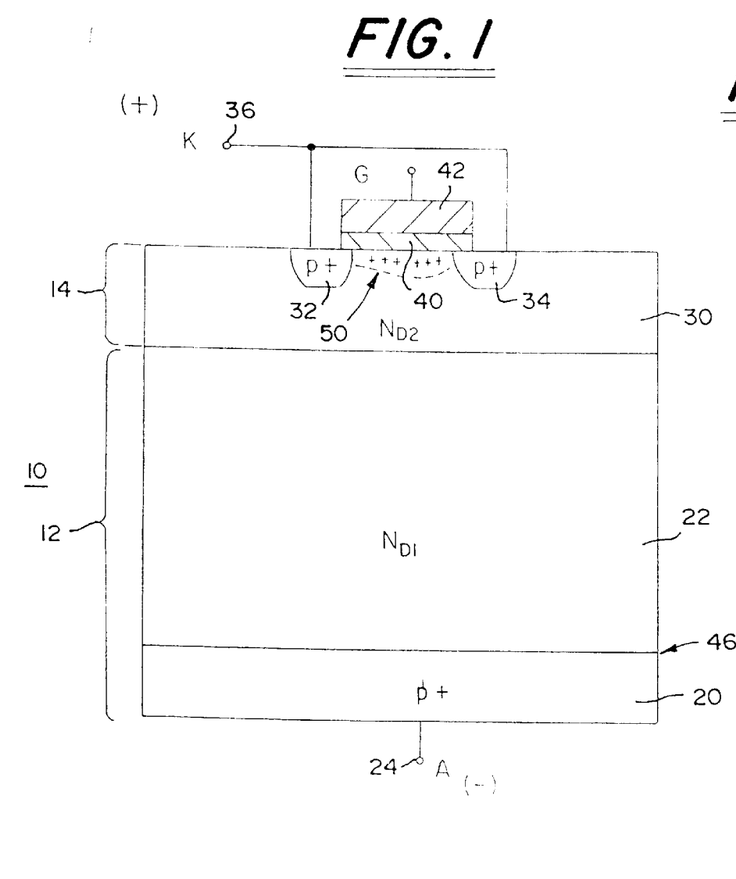
FIG. 1 is a cross-sectional view of a specific embodiment of a tunable semiconductor capacitor, according to the present invention.
Figure 2:
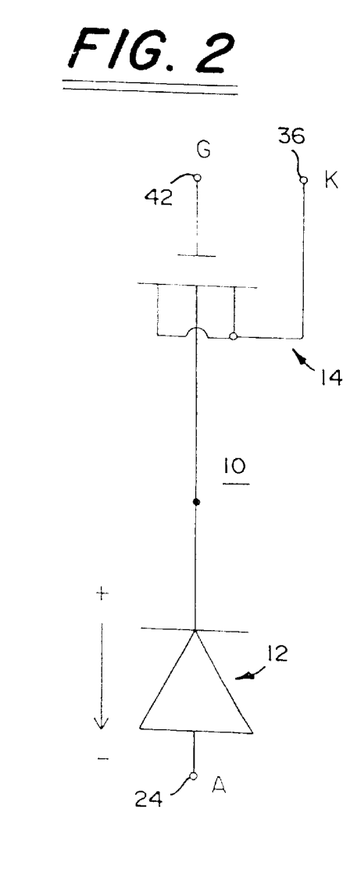
FIG. 2 is a schematic equivalent of the tunable semiconductor capacitor shown in FIG. 1, represented by a first capacitor in the form of a diode, and a MOSFET.
Figure 3:
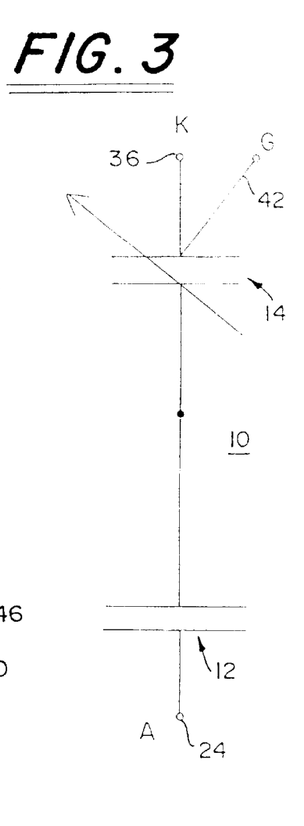
FIG. 3 is a simplified diagrammatic representation of the tunable semiconductor capacitor shown in FIG. 1, represented by a fixed capacitor and a variable capacitor.

Referring now to FIGS. 1–3, FIG. 1 is a cross-sectional view of a tunable semiconductor capacitor 10. FIG. 2 depicts its equivalent structure in the form of a first capacitor 12, shown as a diode, and a second capacitor 14, shown as a MOS device. FIG. 3 depicts its functional equivalent in the form of a fixed capacitor (12) and a variable capacitor (14).

The device structure will now be described in terms of n-type and p-type material. For the purposes of illustration only, the device 10 will be described with specific n-type and p-type structures. However the n-type and p-type structures may be reversed with a corresponding reversal in bias voltage and control voltage polarities without changing the nature of the device. This is similar to transistor applications where a device may be equivalently described in terms of a pnp device or an npn device, interchangeably.

The semiconductor diode capacitor 10 is formed from the combination of the first capacitor 12, referred to hereinafter as the "junction capacitor," or "junction diode," and the second capacitor 14, referred to hereinafter as the "MOS capacitor," or "MOS diode." Reference to the term "diode" is used interchangeably with the term "capacitor" because the capacitors are formed as a pn junction. The junction capacitor 12 provides a fixed capacitance (with a given fixed reverse bias voltage) while the MOS capacitor 14 provides a variable capacitance, as indicated in FIG. 3. The junction capacitor 12 is formed from a layer of p-type material 20 and a layer of n-type material 22, where the n-type material of the junction capacitor has a first doping level of $N_{D1}$. The pn junction essentially defines the junction capacitor 12. As shown in FIGS. 1–3, an anode 24 is coupled to the p-type material 20 of the junction capacitor 12 by conventional contacts.

The MOS capacitor 14 has a structure similar to a field effect transistor or MOSFET having a source, drain, and gate, as will be described hereinafter. Terms corresponding to a MOSFET device, such as gate, source, drain, and the like, are used herein for purposes of illustration and clarity only, as the novel semiconductor diode capacitor 10 operates in a substantially different way than known MOSFET devices. The MOS capacitor 14 includes a layer of n-type material 30 having a second doping level of $N_{D2}$, and two terminal areas 32 and 34 of p-type material formed in the n-type material. The terminal areas 32 and 34 may be isolated "islands" of p-type material, or may be in the form of grooves or channels disposed in the layer of n-type material 30. Any suitable geometric shape of the terminal areas 32 and 34, such as circular, oblong, and the like, may be formed in the layer of n-type material 30. Note that the term "MOS capacitor" describes a semiconductor diode structure having a MOS type layer configured to provide an inversion region, as will be described in greater detail hereinafter.

The doping level $N_{D2}$ of the MOS capacitor 14 is much less than the doping level $N_{D1}$ of the junction diode 12, as is shown in a specific example hereinafter. The layer of n-type material 30 of the MOS capacitor 14 is disposed adjacent the layer of n-type material 22 of the junction capacitor. The first p-type terminal area 32 will be interchangeably referred to as the "source" while the second p-type terminal area 34 will be interchangeably referred to as the "drain." Because the two p-type terminal areas 32 and 34 are externally connected together to define a cathode 36, the device does not function like known MOSFET devices, as no significant current flows between source 32 and drain 34. An oxide region 40 is deposited over a portion of the n-type region 30 of the MOS capacitor 14 and contacts a portion of both p-type regions 32 and 34 of the MOS capacitor. A gate region 42 is then formed over the oxide region 40.

The tunable semiconductor capacitor 10 is a three terminal-device having the anode 24, the cathode 36, and the gate 42. The device structure may be formed using known semiconductor techniques such as epitaxial growth processes having a number of diffusion and deposition steps, ion-beam implantation processes, or any suitable known processes. As shown in FIG. 2, the semiconductor diode capacitor 10 may be viewed as a diode and a MOSFET coupled in a "nose-to-nose" configuration where the first diode or junction diode 12 provides a fixed capacitance and the MOSFET 14 (or MOS diode) provides a variable capacitance that is varied by application of a control voltage on the gate 42.

A general operational overview of the tunable semiconductor capacitor 10 is described below. A biasing voltage is applied to the cathode 36 and the anode 24 such that the cathode is more positive than the anode. Because the anode 24 is essentially negative and is in contact with the p-type material 20 of the junction capacitor 12, the junction capacitor is reverse biased. This biasing scheme also dictates that the p-type terminal areas 32 and 34 of the MOS capacitor 14 are positive relative to the n-type adjacent layer 30. Accordingly, the MOS capacitor 14 is slightly, forward biased. This creates some parasitic capacitance. Because the junction capacitor 12 is reverse biased, no significant current flows from cathode to anode. Also, because the junction capacitor 12 is reverse biased, a space charge depletion region is formed about a junction 46 of the p-type material 20 and the n-type material 22 of the junction capacitor 12. The depleted space charge region simulates the "plates" of a capacitor and therefore, the junction capacitor 12 provides a relatively fixed value of capacitance for a given cathode-to-anode DC reverse bias voltage.

To provide variable capacitance, a control voltage is applied to the gate 42 of the MOS capacitor 14. As the gate 42 is made more negative than the cathode 36, the threshold voltage is reached and an inversion region 50 begins to form under the gate between the two terminal areas 32 and 34. The MOS capacitor 14 thus operates as an enhancement-type MOSFET device because a depletion region of enhanced conductivity is formed. As the gate voltage becomes more negative than the cathode voltage, holes (p) are attracted toward the negative gate 42 while electrons (n) are repelled, hence forming the inversion region 50. Although the holes are minority carriers in the n-type material 30, they form a conduction path between the two p-type terminal areas 32 and 34 and act as majority carriers between the two terminal areas. However, because both p-type terminal areas 32 and 34 are at the same voltage, no substantial current flows between the two p-type terminal areas—essentially there is no current flow from source to drain.

The inversion region 50 also represents a depleted region in the semiconductor and provides the MOS capacitor 14 with capacitance. The depth of the depletion region 50, caused by application of a gate voltage, determines the capacitance of the MOS capacitor 14. Thus, the tunable semiconductor capacitor 10 is formed from the combination of the junction capacitor 12 providing a fixed capacitance, and the MOS capacitor 14 providing a variable capacitance determined solely by the gate voltage, which is independent of the cathode-to-anode DC biasing voltage.

A more detailed operational description and mathematical analysis of the semiconductor diode capacitor 10 follows. With respect to the junction capacitor 12 formed front the layer of p-type material 20 and the adjacent layer of n-type material 22 having a doping level of $N_{D1}$, the junction 46 of the substrate and the drift region (n-type region) 22 supports the reverse bias voltage applied between the anode 24 and the cathode 36. The thickness and the doping level of the drift region 22 are determined by the breakdown voltage of the device, governed by equation 1 as follows:

Equation 1:

$$V_{BD} = 5.34 \times 10^{13} N_{D1}^{-3/4}$$

$$W_D = (4010 \epsilon_{Si} N_{D1}^{-7/8})/q$$

where $V_{BD}$ is the breakdown voltage, $N_{D1}$ is the doping level of the n-type material 22 of the junction capacitor 12, $W_D$ is the width of the depletion region, q is the electronic charge, and $\epsilon_{Si}$ is the permitivity corresponding to silicon. Thus, for a fixed DC reverse voltage bias, the capacitance per unit area corresponding to the depletion capacitance of the junction capacitor 12 is governed by equation 2 as follows:

Equation 2:

$$C_D = \sqrt{\frac{q \epsilon_{Si} N_{D1}}{2 V_{DC}}}$$

where $C_D$ is the depletion capacitance per unit area $N_{D1}$ is the doping level of the n-type material 22 of the junction capacitor 12, and $V_{DC}$ is the magnitude of the DC reverse bias voltage. Accordingly, the area of the junction capacitor 12 is dictated by the desired value of the capacitance. This capacitance represents the relatively fixed capacitance set by a particular value of the DC reverse bias voltage.

With respect to the MOS capacitor 14, the capacitance can vary from a minimum value to a maximum value. The maximum value of the capacitance of the MOS capacitor 14, $C_{ox}$, is determined by the thickness of the oxide layer 40 disposed under-the gate 42. Preferably, this is a fixed design parameter. The minimum value of the capacitance of the MOS capacitor 14 is governed by equation 3 as follows:

Equation 3:

$$C_{min} = \frac{C_{ox}}{1 + \frac{\epsilon_{Si}}{\epsilon_{ox}} W_{Si}}$$

where $C_{min}$ is the minimum capacitance of the MOS capacitor 14, $C_{ox}$ is the maximum value of capacitance due to the oxide layer 40, and $W_{Si}$ is the width or extent of the depletion region 50 in the silicon substrate 30 at the time of inversion. The capacitance corresponding to the inversion region 50 is controlled by the voltage applied to the gate 52 relative to the cathode 36. As described above, the MOS capacitor 14 is slightly forward biased as dictated by the DC bias voltage applied between the cathode 36 and the anode 24. Also note that because the source and drain 32 and 34, corresponding to the two terminal areas of p-type material are at the same potential, essentially no current flows between the source and drain. Therefore, all of the DC voltage is supported by the device 10 across the "depth" of its layers or various substrates. Preferably, the area of the source and drain 32 and 34 contacts (where the cathode 36 contacts the p-type material 32 and 34) is made sufficiently small to minimize parasitic capacitance of the junction.

A doping level, $N_{D2}$ of the n-type material 30 of the MOS capacitor 14 provided at the interface of the oxide layer 40 is substantially less than the doping level $N_{D1}$ of the n-type material 22 of the junction capacitor 12. This minimizes the junction capacitance of the source/drain region and also ensures a maximum capacitance swing of the MOS capacitor, as set forth by equation 3 above. Accordingly, in the MOS capacitor 14, the layer of lightly doped n-type material 30 facilitates the variation in capacitance (controlled by application of the gate voltage) while the relatively heavily doped n-type region 22 of the junction capacitor 12 provides a fixed capacitance (controlled by the DC reverse bias voltage) and supports the DC voltage across the device 10.

As described above, application of the gate voltage (where the gate voltage is less than the cathode voltage) causes the inversion region 50 to form under the gate and between the source and drain 32 and 34. Once the oxide capacitance is "cut-off" due to formation of the inversion region 50, the resultant capacitance is only due to the inversion region in the n-type material 30 of the MOS capacitor 14. Therefore, the minimum capacitance, $C_{min}$, is governed by equation 4 below:

Equation 4:

$$C_{min} = \sqrt{\frac{qN_{D2}\varepsilon_{Si}}{2V_t\ln(N_{D2}/n_i)}}$$

where $N_{D2}$ is the doping level of the n-type material 30 of the MOS capacitor 14, $V_t$ is the thermal voltage, and $n_i$ is the intrinsic carrier concentration. The thermal voltage is equal to 26 millivolts at a temperature of 300 degrees Kelvin where thermal voltage is defined as kT/q and k is the Boltzman constant. Accordingly, the net capacitance of the semiconductor diode capacitor 10 is governed by equation 5 below:

Equation 5:

$$C_{Net} = \frac{C_{Diode}C_{MOS}}{C_{Diode} + C_{MOS}}$$

where $C_{net}$ is the net capacitance, $C_{Diode}$ is the capacitance of the junction capacitor 12, and $C_{MOS}$ is the capacitance of the MOS capacitor 14. Because the MOS capacitor 14 is in series with the junction capacitor, the total capacitance is determined as the product over the sum. To maximize the influence of the capacitance of the MOS capacitor 14 to obtain a suitable tunable range of capacitance, the maximum value of $C_{MOS}$ is equated to the capacitance of the MOS diode or MOS capacitor 14. The ratio r is the maximum and minimum values of capacitance of the tunable semiconductor capacitor 10 and k is the tuning range of the MOS capacitor 14 acting alone. Equation 6 below defines the ranges as follows:

Equation 6:

$$C_{Net,max} = \frac{C_{Diode}}{2}, C_{Net,min} = \frac{C_{Diode}}{k+1}$$
$$\Rightarrow \frac{C_{Net,max}}{C_{Net,min}} = \frac{k+1}{2} = r$$

To obtain the desired ratio k, the thickness of the oxide layer 40 and the doping level of the MOS capacitor 14 must be suitably adjusted as design parameters. For some applications, a wide AC voltage swing of the signal must be accommodated. Thus, the oxide layer 40 must be capable of supporting the AC voltage. If the AC signal voltage. $V_{ac}$ is the amplitude of the applied signal, then the thickness of the oxide layer 40 is set forth by equation 7 below:

Equation 7:

$$t_{ox} = \frac{kV_{ac}}{(k+1)E_M}$$

where $t_{ox}$ is the oxide layer 40 thickness, $V_{ac}$ is the AC signal voltage superimposed on top of the DC reverse bias voltage applied between anode 24 and cathode 36, and $E_M$ is the breakdown field of the oxide layer, or the value of the electric field that will cause the oxide layer to "short." Typically, the value of $E_M$ varies from 4MV/cm to 8MV/cm. From the value the oxide thickness $t_{ox}$ and the value of the desired ratio k, the value of the doping level $N_{D2}$ of the n-type material 30 of the MOS capacitor 14 can be determined using equation 4, where $C_{ox}/C_{min}=k$.

Based upon the above equations, design parameters may be obtained for any selected values of the DC reverse bias voltage $V_{DC}$, the AC signal voltage $V_{ac}$, capacitance, and the minimum-to-maximum capacitance ratio k. Preferably, the thickness of the oxide layer 40 should not exceed 4 um and the substrate doping ($N_{D2}$) of the drift region 30 should not be reduced lower than $2\times10^{13}/cm^3$. This places a limitation on the maximum voltage swing and the highest achievable capacitance ratio for a particular application.

As described above, the semiconductor diode capacitor may be formed having n-type drift regions or p-type drift regions, with a corresponding modification in the applied voltages and structure. That is, the semiconductor diode 10 may be formed of the opposite types of material such that the MOS diode 14 has a p-type substrate with two n-type terminal areas (source and drain) and the junction diode 12 has n-type material connected to the anode 24. In such a situation, the adjacent layers of the two diodes 12 and 14, or drift regions are formed of p-type material. In this situation, the oxide region 40 would not experience high voltages because the anode is typically grounded in such applications. However, if the drift regions are formed from n-type material, as shown in FIG. 1, the resistive loss is smaller due to the higher carrier mobility.

Figure 4:
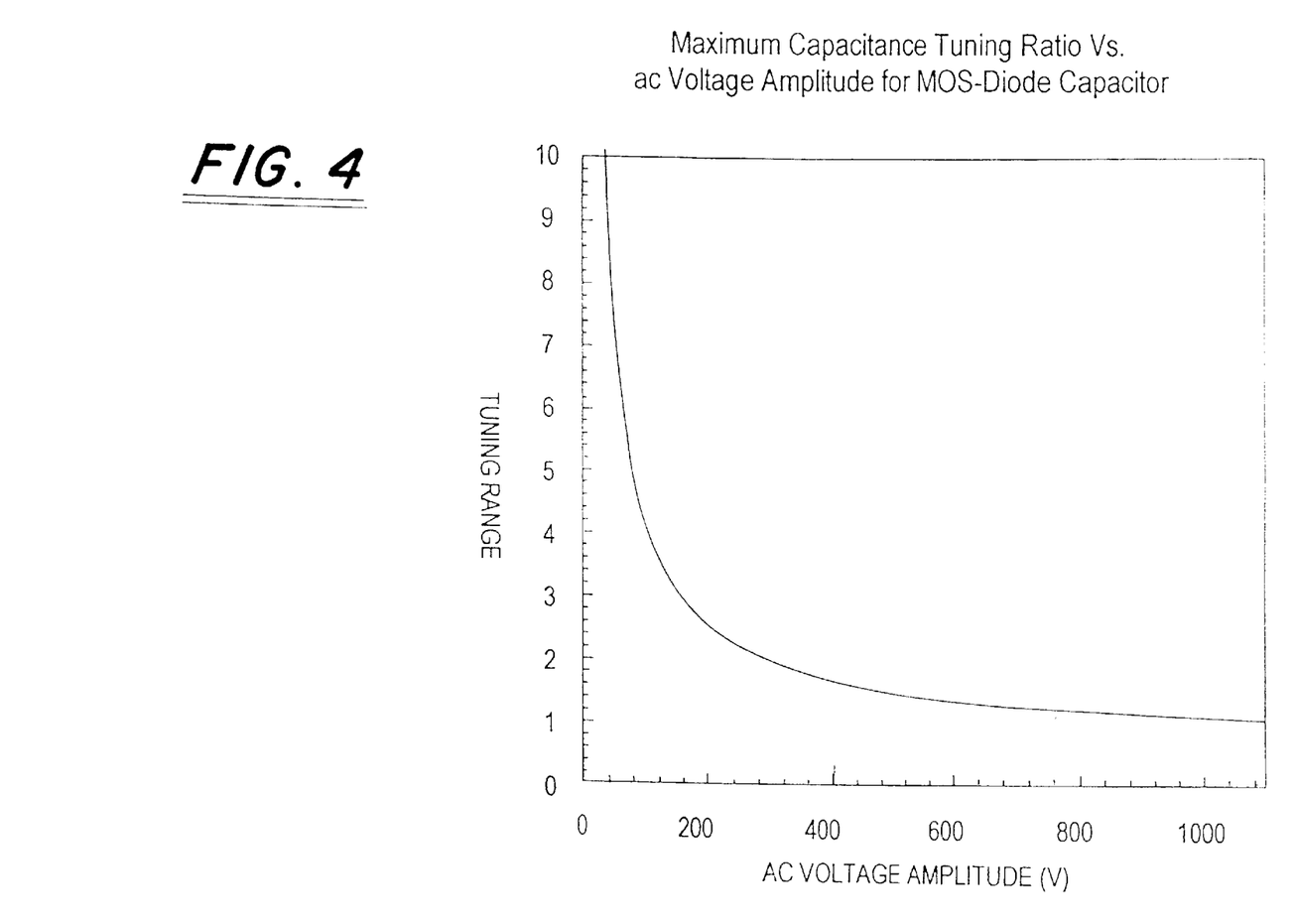
FIG. 4 is a graph of maximum achievable capacitance ratio as a function of AC signal voltage.

Referring now to FIGS. 1 and 4, FIG. 4 is a graph plotting the maximum capacitance ratio r as a function of the AC signal voltage. As the AC voltage amplitude increases, a thicker oxide layer 40 is needed to withstand the stress of the applied voltage. Increasing the thickness of the oxide layer 40 reduces the capacitance swing of the MOS capacitor 14, and therefore limits the ratio of minimum to maximum capacitance. Accordingly, the tuning range of the device 10 is limited.

Figure 5:
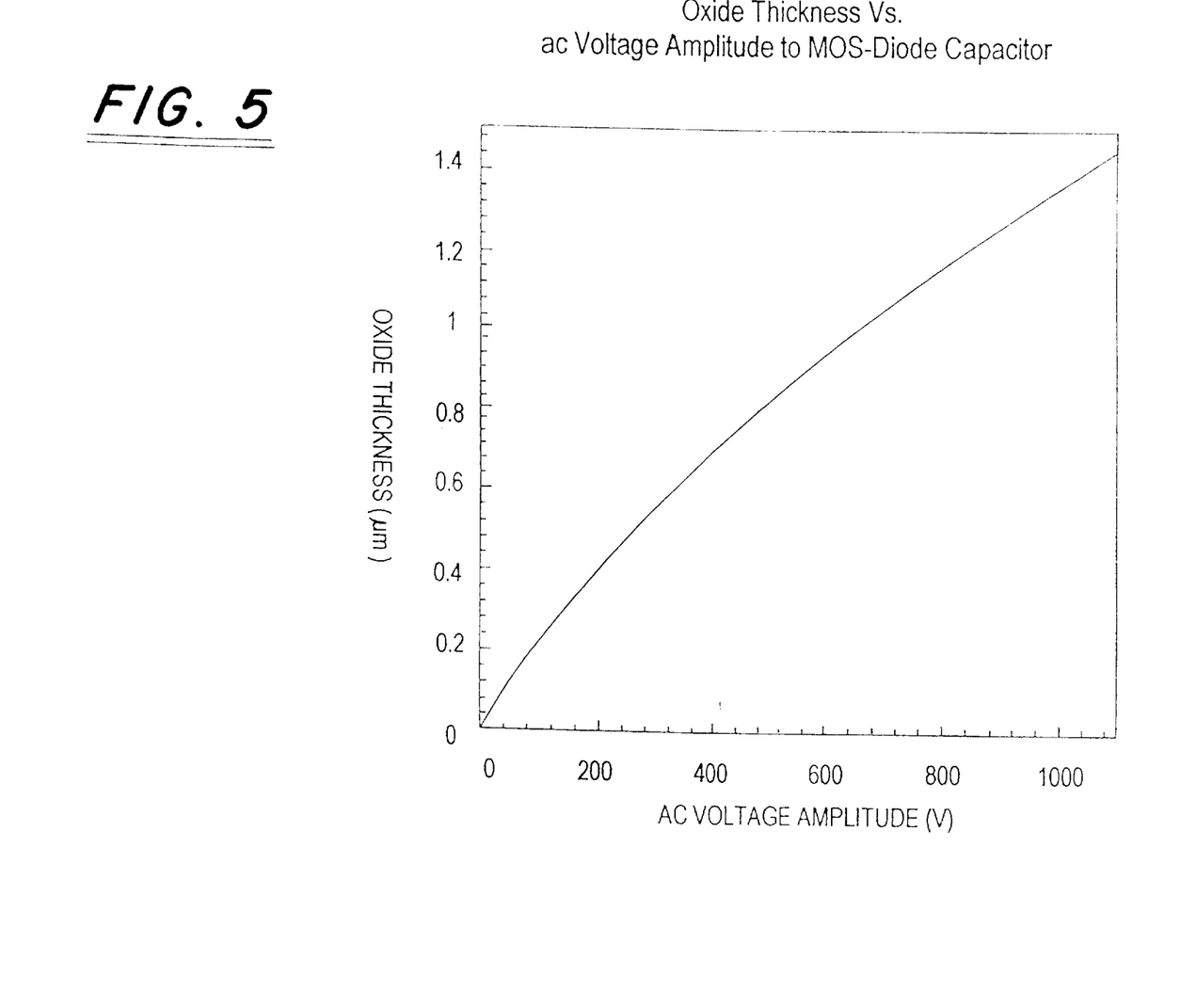
FIG. 5 is a graph of required oxide thickness as a function of AC signal voltage for a maximum tuning range.

Referring now to FIGS. 1 and 5, FIG. 5 is a graph plotting the thickness of the oxide layer 40 as a function of the AC signal voltage. As described above, as the AC voltage amplitude increases, the thickness of the oxide layer 40 must also increase. For example, at an AC voltage amplitude of about 1000 volts, the thickness of the oxide layer 40 is about 1.4 um. If the AC voltage is too great, the oxide layer 40 will breakdown and conduct causing a short-circuit.

For example, the following values illustrate selected design parameters for one embodiment of the semiconductor diode capacitor 10 as follows:

Application constraints
  $V_{DC}$=500 volts
  $V_{ac}$=100 volts
  $C_{max}$=200 pF
  r(ratio)=4.0

To accommodate the above application parameters, the following design parameters may be used:

Junction Capacitor 12 Design Parameters
  Drift region doping ($N_{D1}$)=$2.8\times10^{14}/cm^3$
  Drift region (22) Thickness=60 um
  Capacitance per unit area=217 pf/cm$^2$
  Junction diode (12) area=1.8413 cm$^2$ MOS capacitor 14 Design Parameters
  Oxide layer (40) thickness=2190 Angstroms
  Oxide layer (40) capacitance=15.8 nF/cm$^2$
  Substrate Doping ($N_{D2}$)=$2.3\times10^{13}/cm^3$
  Minimum capacitance=2.25 nF/cm$^2$
  MOS diode (14) area=0.0254 cm$^2$ Note that the doping levels of the n-type material 22 of the junction diode 12 is about an order of magnitude greater than the doping levels of the n-type material 30 of the MOS diode 14.

Figure 6:
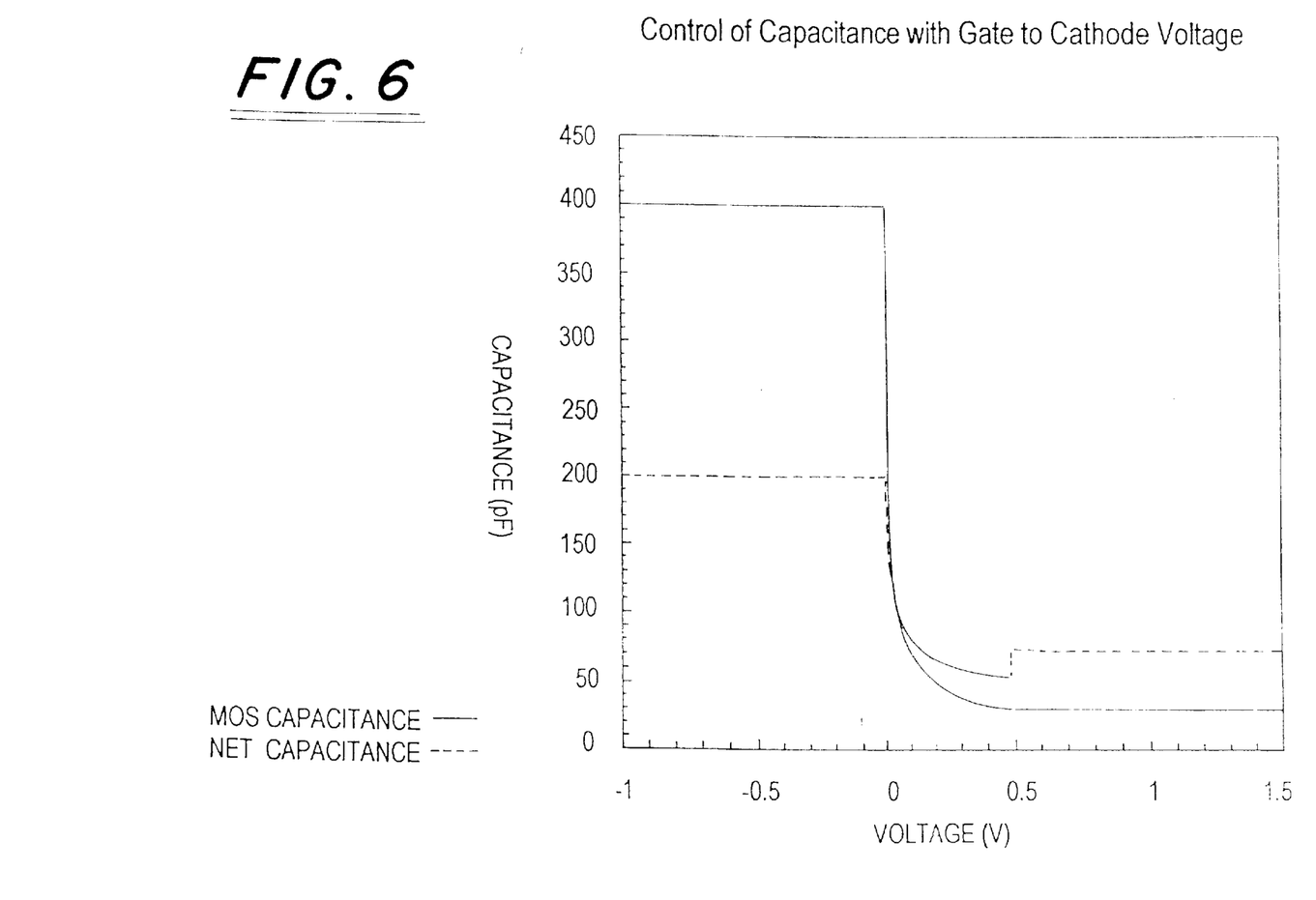
FIG. 6 is a graph showing MOS device capacitance and junction capacitor capacitance as a function of gate-to-cathode voltage.

Referring now to FIGS. 1 and 6, FIG. 6 is a graph plotting the capacitance of both the MOS capacitor 14 and the overall capacitance of the tunable capacitor 10 as a function of the gate voltage. As shown, the variation in capacitance is due to the tunable range of the MOS capacitor 14.

Figure 7:
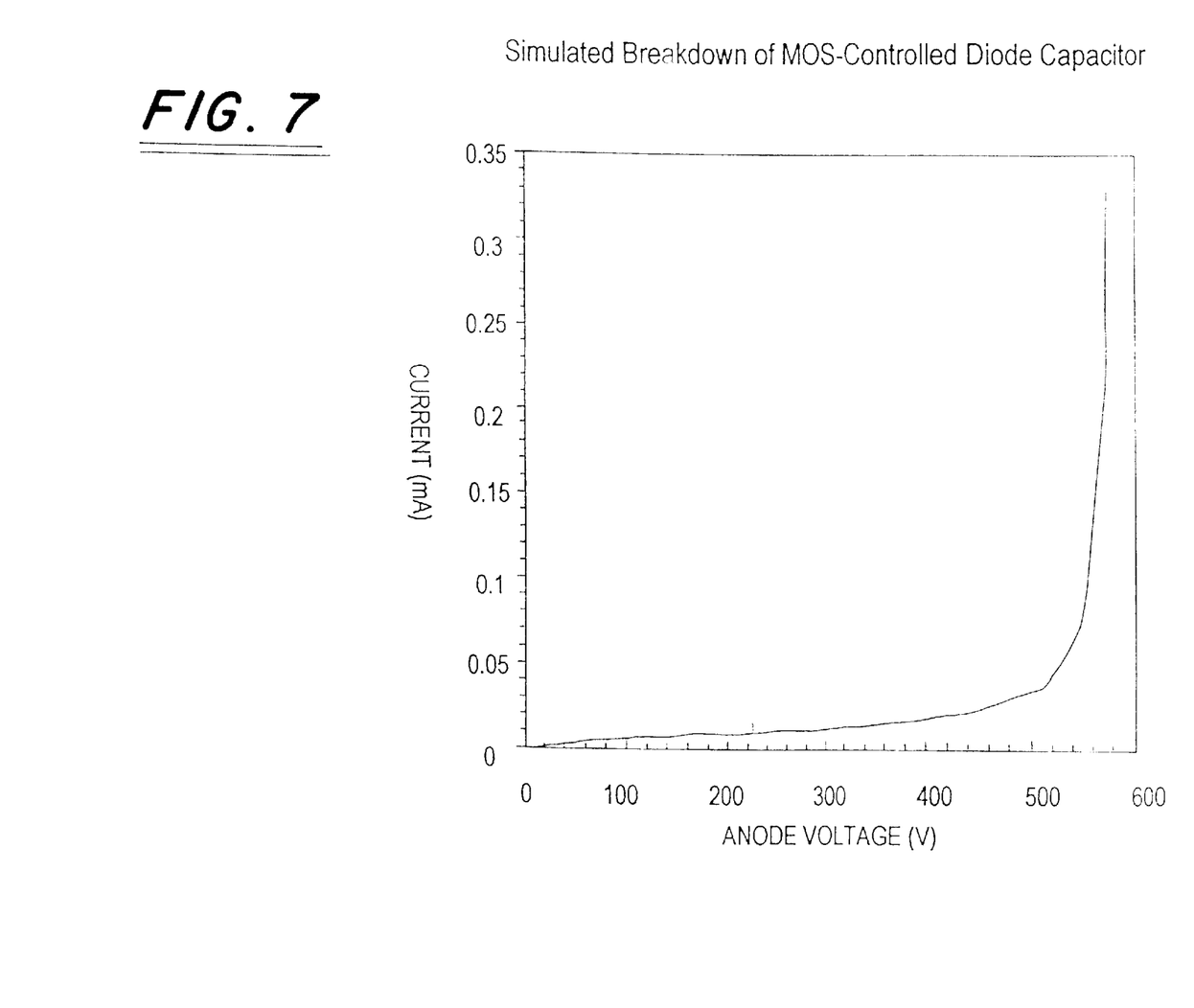
FIG. 7 is a graph of breakdown current as a function of anode voltage.

Referring now to FIGS. 1 and 7, FIG. 7 is a graph plotting the reverse breakdown characteristics of the semiconductor diode capacitor 10. The graph shows simulated values only.

Specific embodiments of a semiconductor diode capacitor according to the present invention have been described for the purpose of illustrating the manner in which the invention may be made and used. It should be understood that implementation of other variations and modifications of the invention and its various aspects will be apparent to those skilled in the art, and that the invention is not limited by the specific embodiments described. It is therefore contemplated to cover by the present invention any and all modifications, variations, or equivalents that fall within the true spirit and scope of the basic underlying principles disclosed and claimed herein.

What is claimed is:

1. A tunable capacitor comprising:
   a first capacitor formed from semiconductor material and having an anode;
   a second capacitor integrally formed with the first capacitor from semiconductor material and having a cathode, the second capacitor operatively coupled in series with the first capacitor;
   the second capacitor formed with a field effect layer configured to provide a depletion region proximate the cathode, the depletion region controlled by applying a control voltage to a control terminal of the field effect layer;
   the first capacitor being reverse biased by application of a reverse bias voltage between the anode and the cathode to provide a predetermined capacitance; and
   the control voltage applied to the control terminal to vary the depletion region such that a capacitance of second capacitor is varied independently of the reverse bias voltage.

2. The tunable capacitor according to claim 1 wherein the first capacitor provides a substantially fixed capacitance and the second capacitor provides a variable capacitance.

3. The tunable capacitor according to claim 1 wherein an overall capacitance of the tunable capacitor is substantially governed by a value of capacitance of the second capacitor.

4. The tunable capacitor according to claim 1 wherein the application of the reverse bias voltage reverse biases the first capacitor while slightly forward biasing the second capacitor.

5. The tunable capacitor according to claim 1 wherein a total capacitance of the tunable capacitor is substantially equal to a series capacitance of the first capacitor and the second capacitor.

6. The tunable capacitor according to claim 1 wherein the second capacitor includes a MOS layer.

7. The tunable capacitor according to claim 1 wherein the second capacitor is formed as a MOS field-effect device.

8. The tunable capacitor according to claim 1 wherein a drift region of the first capacitor is formed of n-type material and a drift region of the second capacitor is formed of n-type material, and configured such that the drift region of the first capacitor has a doping level substantially greater than a doping level of the drift region of the second capacitor.

9. The tunable capacitor according to claim 1 wherein a drift region of the first capacitor is formed of p-type material and a drift region of the second capacitor is formed of p-type material, and configured such that the drift region of the first capacitor has a doping level substantially greater than a doping level of the drift region of the second capacitor.

10. The tunable capacitor capacitor according to claim 1 wherein the first and second capacitors are integrally formed from semiconductor material in a nose-to-nose series configuration.

11. The tunable capacitor according to claim 1 wherein the series coupling between the first and second capacitors is defined by adjacent regions of n-type material corresponding to the first and second capacitors respectively, such that the adjacent regions are both formed of n-type material.

12. The tunable capacitor according to claim 11 wherein doping levels of the adjacent regions are substantially different.

13. The tunable capacitor according to claim 1 wherein the series coupling between the first and second capacitors is defined by adjacent regions of p-type material corresponding to the first and second capacitors respectively, such that the adjacent regions are both formed of p-type material.

14. The tunable capacitor according to claim 13 wherein doping levels of the adjacent regions are substantially different.

15. A method of forming a tunable capacitor comprising the steps of:
   providing a first capacitor formed from semiconductor material and having a first terminal defining an anode;
   providing a second capacitor integrally formed with the first capacitor from semiconductor material and having a second terminal defining a cathode, the second capacitor operatively coupled in series with the first capacitor;
   the second capacitor formed having a field effect layer configured to provide a depletion region proximate the cathode, the depletion region controlled by applying a control voltage to a control terminal of the field effect layer;
   reverse biasing the first capacitor by applying a reverse bias voltage between the anode and the cathode to provide a predetermined capacitance corresponding to the first capacitor; and
   applying the control voltage to the control terminal of the second capacitor to vary the depletion region such that a capacitance of second capacitor is varied independently of the reverse bias voltage.

16. A tunable capacitor having a plurality of conductivity regions comprising:
   a first substrate having a first conductivity type;
   a second substrate having a second conductivity type forming a drift region adjacent the first substrate, the first and second substrates forming a first capacitor;
   a third substrate of the second conductivity type formed adjacent the second substrate;
   terminal regions of the first conductivity type formed in the third substrate, the third substrate and the terminal regions forming a field effect device; and
   a gate region disposed over a portion of the terminal regions and a portion of the third substrate to facilitate formation of a depletion area between the terminal regions.

17. The tunable capacitor according to claim 16 where the second substrate has a substantially higher doping concentration than a doping concentration of the third substrate.

18. The tunable capacitor according to claim 16 wherein the first capacitor provides a substantially fixed capacitance and the field effect device provides a variable capacitance.

19. The tunable capacitor according to claim 16 wherein an overall capacitance of the tunable capacitor is substantially governed by a value of capacitance of the field effect device.

20. The tunable capacitor according to claim 16 wherein the first capacitor is reverse biased by application of a reverse bias voltage between the first substrate and the terminal regions while the reverse bias voltage causes a coupled source and drain junction of the field effect device to be slightly forward biased relative to the third substrate.

21. The tunable capacitor according to claim 16 wherein a total capacitance of the tunable capacitor is substantially equal to a series capacitance of the first capacitor and the field effect device.

22. The tunable capacitor according to claim 16 wherein the field effect device is a MOS layer.

23. The tunable capacitor capacitor according to claim 16 wherein the terminal regions are externally connected together to define at least one of an anode and a cathode.

* * * * *